United States Patent [19]

Lacour et al.

[11] Patent Number: 4,494,478
[45] Date of Patent: Jan. 22, 1985

[54] DEVICE FOR THE INTRODUCTION AND/OR THE REMOVAL, IN AN AIRTIGHT MANNER OF SOLID BODIES ACROSS ONE APERTURE AT LEAST OF AN ENCLOSURE TREATMENT, MORE PARTICULARLY UNDER LOW PRESSURE

[75] Inventors: Gilles Lacour, Andrezieux-Boutheon; Serge Esteveny, St. Just-St. Rambert, both of France

[73] Assignee: Centre Stéphanois de Recherches Mécaniques Hydromecanique et Frottement, France

[21] Appl. No.: 465,503

[22] Filed: Feb. 10, 1983

[30] Foreign Application Priority Data

Feb. 11, 1982 [FR] France ............... 82 02717

[51] Int. Cl.³ ............................................. B05C 3/00
[52] U.S. Cl. ........................................ 118/50; 118/405;
118/428; 118/429; 427/434.7
[58] Field of Search .................. 118/50, 405, 428, 429;
427/434.7; 68/5 D

[56] References Cited

U.S. PATENT DOCUMENTS

| 2,509,699 | 5/1950 | Sherrill | 68/180 |
| 2,661,619 | 12/1953 | Helle | 68/6 |
| 2,853,970 | 9/1958 | Novak | 118/49 |
| 3,055,080 | 9/1962 | Claussen et al. | 28/100 |
| 3,240,037 | 3/1966 | Bittle et al. | 68/5 D |
| 3,868,104 | 2/1975 | Hunt et al. | 270/30 |
| 3,952,568 | 4/1976 | Wareing et al. | 118/50 |

Primary Examiner—John E. Kittle
Assistant Examiner—James J. Seidleck
Attorney, Agent, or Firm—Eric P. Schellin

[57] ABSTRACT

A seal permitting wire, rod or the like to fed into a chamber at low pressure comprising a Venturi tube constituting in its interior and in succession a convergence a neck and a divergence. The tube has a coaxial sleeve on its convergence side into which the solid to be treated can be introduced. This sleeve is partially engaged inside the Venturi tube over a length determined so as to create a rapid change of section which defines a dynamic joint zone in combination with the pressure, flow and speed of the fluid injected toward the inside of the Venturi tube.

8 Claims, 9 Drawing Figures

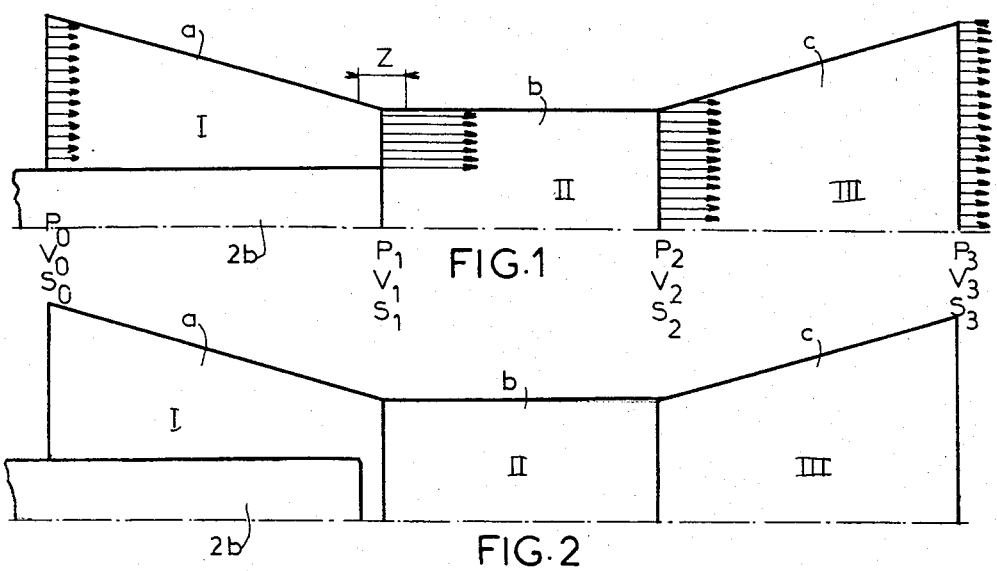
FIG. 1
FIG. 2
FIG. 3
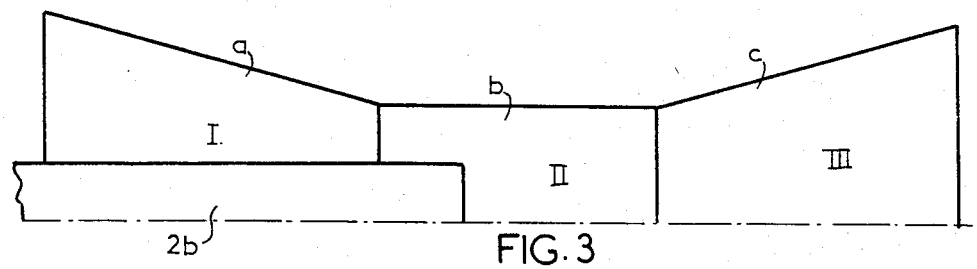
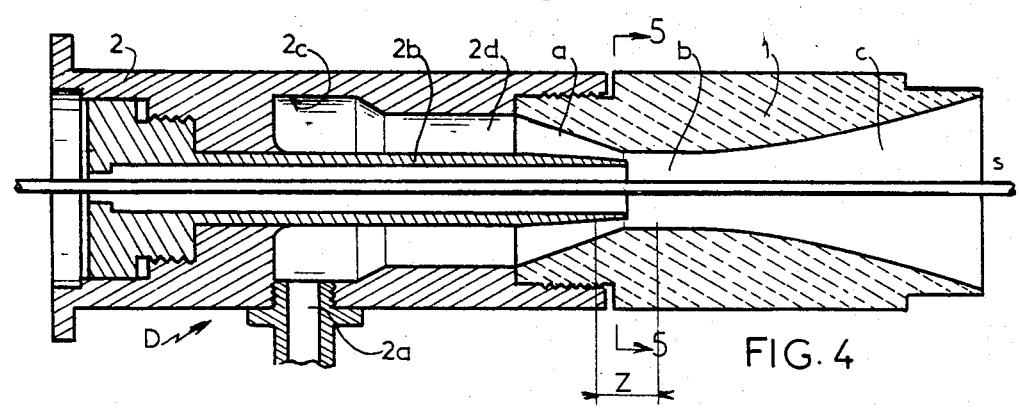
FIG. 4
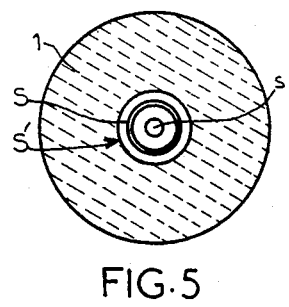
FIG. 5
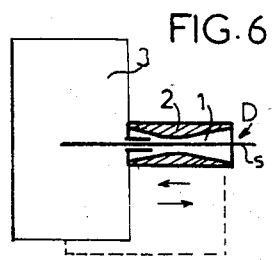
FIG. 6
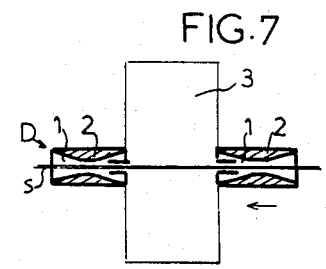
FIG. 7

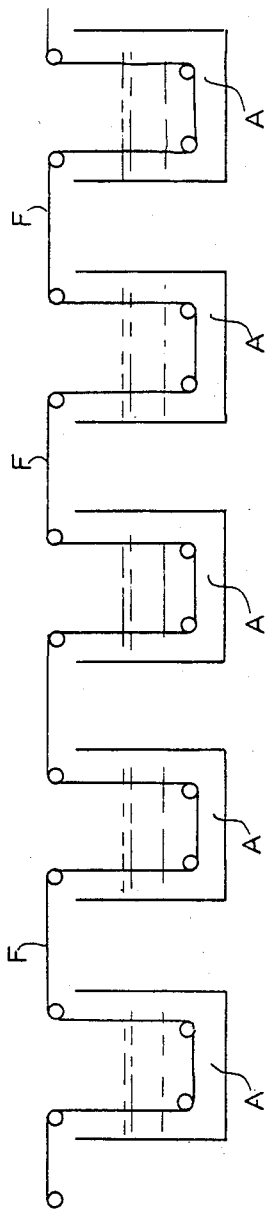
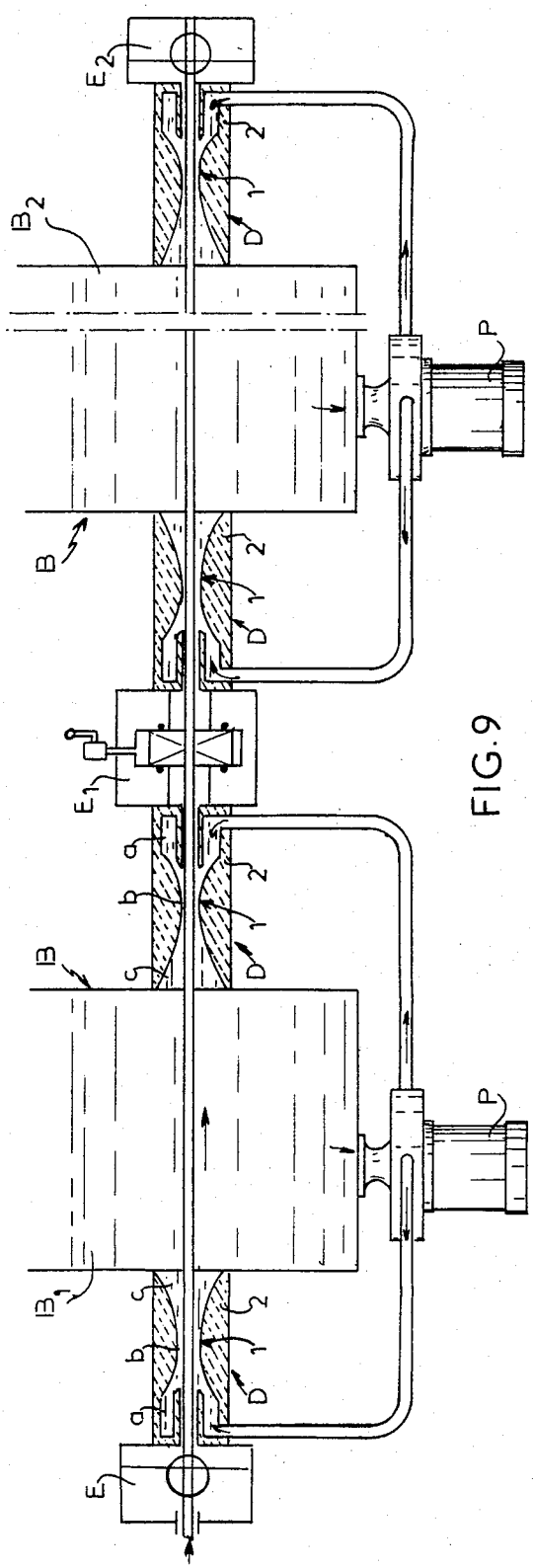

DEVICE FOR THE INTRODUCTION AND/OR THE REMOVAL, IN AN AIRTIGHT MANNER OF SOLID BODIES ACROSS ONE APERTURE AT LEAST OF AN ENCLOSURE TREATMENT, MORE PARTICULARLY UNDER LOW PRESSURE

BACKGROUND OF THE INVENTION

The present invention has for its object a device for the introduction and/or the removal, in an airtight manner, of solid bodies across at least one aperature of an enclosure treatment, more particularly under low pressure.

The object of the invention pertains more particularly fluid dynamics.

Many up to date surface treatments are carried out within enclosures in which a more or less substantial vacuum is provided. There are such treatments which are carried out with a vacuum in the order of 1,333. Pascal, for instance the treatments in the vapour stage, or in the order of $1,333.10^{-1}$ Pascal, this is for instance the case of the deposits of titanium nitride through spraying.

At the present time, the machines for vacuum treatment are discontinuous. In a general manner, they have a series of chambers in which different vacuum heads may prevail, said chambers being adapted for scouring, treating, drying, cooling, etc. in succession. Each successive step is characterized by the simultaneous opening of a plurality of valves which separate the enclosures two by two, and by the advancement of the whole of the treatment line, equal to the modular length of one enclosure. After each valve closing, the vacuum pump assemblies are actuated in order to restore the desired pressure.

Such systems are not suitably adapted for treating products of substantial length or continuous, solid products, such as wires or sheet metals. When the solid body is travelling between two consecutive enclosures, as the pressure differences on either side of the wall are rather small, it is possible to do with a single aperture of communication, the discharge of the pumps compensating the leakage from an enclosure to the other one. However, the problem is different when the solid body is to be passed from the outside into the first enclosure, or from the last enclosure towards the outside. In this case, the well-known conventional systems are all of them burdened with defects, the more often latent ones.

This is more particularly the case with the following treatment procedures:

When as small clearance as possible is desired between the wire, or the sheet metal, and the outlet aperture, there is a scraping of the product against the wall. Although the resulting marks or scratching could sometimes be tolerated, prior to the treatment of the product, they occur again after the treatment, when the product is leaving the apparatus.

When it is desired to cause a friction of the product, either a product of some length or a continuous product, within the interior of an elastic sphincter, there are then further drawbacks to be encountered as soon as the pressures are falling below some tens torrs, among which: degassing of the product, saturating vapour tension, exposure to heat or cold, pollution of the surface of the treated product, etc.

When it is desired to have the product passed through a duct with a clearance of sufficient width to prevent the contact, and when various offset portions are provided, each one with suction means, it is then necessary to arrange a power rating in excess. Moreover, in the case of a continuous product, which is broken inadvertently, the automatic re-threading of said product without stopping the line is elaborate and rather uneasy.

The obtention of a sealing, or at least of a sealing in part, by means of ferrofluids has also been suggested. However, there is here to be encountered either the saturating vapour tension of the liquid part of the ferrofluid, or the magnetism of the product; for instance, it is not possible to obtain a sealing with ferrofluids subjected to a magnetic field when the is on a basis of iron.

In accordance with the invention, and to overcome these disadvantages, a device has been provided in a particularly simple and efficient manner, which permits the introduction and/or the removal, in a substantially airtight manner, of solid bodies across at least one aperture of a treatment enclosure the internal pressure of which is lower than the pressure in the immediate surroundings.

SUMMARY

For this purpose, the device is remarkable in that it is comprised of a venturi tube constituting internally and in succession a convergent, a neck and a divergent, said tube being connected, on the side of the convergent with a sleeve arranged and equipped to permit the injection of a fluid under pressure and the flow thereof toward the interior of the venturi tube; said sleeve, capable of being coupled to the enclosure, low pressure tank or the like, being provided internally, directly or in an inserted manner, with an axial sheath for introduction and communication between the aperture of said enclosure or the like and the venturi tube, said sheath co-operating with the convergent of the venturi tube practically up to the level of the neck, in order to form at this level a sudden change in section the effect of which is to define a dynamic sealing area in combination with the pressures of the fluid, the solid body or bodies being arranged to be introduced on the side of the divergent to be engaged without friction within the bore of the communication sheath in order to be introduced entirely and completely dry within the interior of the enclosure.

These and further characteristics will be apparent from the following description.

To make the object of the invention better understood without however restricting it thereby, in the attached drawings:

BRIEF DESCRIPTION OF THE DRAWINGS

FIGS. 1, 2 and 3 are views of a purely schematical character, showing, in accordance with three alternative forms of embodiment, the principle of the fluid flow applicable to the device of the invention.

FIG. 4 is a view in longitudinal cross-section of an example, not restrictive in any way, of embodiment of the device.

FIG. 5 is a view in transverse cross-section along the line 5—5 of FIG. 4.

FIGS. 6 and 7 illustrate by schematical views two examples of possible application for the device.

FIG. 8 is a schematical view showing a chemical treatment of the wire in accordance with the prior art.

FIG. 9 shows the chemical treatment of a wire with the application of the device in accordance with the invention.

DETAILED DESCRIPTION

To make the object of the invention more concrete, this object will be described now in a non-limiting manner, with reference to the examples of embodiment illustrated in the Figures of the drawing.

In accordance with the invention, and as shown more particularly in FIGS. 1, 2 and 3, it has been contemplated to use the principle of the fluid horns for a novel application as immaterial seals. In the case of a laminar flowing, it is possible to achieve the following pattern: the fluid, starting from an initial pressure (P0), from a speed (V0), goes through a zero pressure or a practically zero pressure at the level of a sudden section widening to rise up again to atmospheric pressure at the outlet. For this purpose, the flowing is divided into three parts I, II and III respectively.

In the first part I (FIG. 1), the pressure energy of said fluid is transformed into kinetic energy by a convergence (a) which serves for putting the fluid in motion. In the part II, which corresponds to a neck (b), a sudden change in section occurs; the fluid, initially in the section (So), at the speed (V0) and at the pressure (P0), is suddenly caused in a section (S1) to pass to a speed (V1) and to a pressure (P1) which is practically zero. A loss of energy through impacts is taken into consideration.

In the third part III, the kinetic energy is transformed into a pressure potential energy by a divergence (c). From the section (S2) to the section (S3), at the outlet of the divergence (c), the fluid is caused to pass from the velocity (V2) to the velocity (V3) and from the pressure (P2) to the pressure (P3) corresponding approximately to the atmospheric pressure.

It will be noted that the sudden change in section might occur either at the level of the connecting portion of the convergence (a) and of the neck (b) (FIG. 1), or ahead of the neck (b) (FIG. 2), or on a portion of the length of the neck (b) (FIG. 3).

In a preferred manner, the sudden change in section is not originated within the divergence (c), as this would impair the efficiency.

At the level of this sudden change in section, there is formed, in combination with the fluid flow, an area (2) corresponding to a dynamic sealing area. This physical process is particularly important and advantageous for promoting the travel of a solid body (a wire for instance) from any location at a pressure (P3) into, for instance, an enclosure the pressure (Po) of which is lower, and this with a steady and complete sealing between the two locations.

Referring now to FIG. 4, there is shown here an example, which is not restrictive in any way, of embodiment of the device on the basis of the fundamental principles stated above.

The device includes essentially a venturi tube (1) which constitutes internally and in succession the convergence (a), the neck (b) and the divergence (c). This Venturi tube (1) is integral, in a detachable manner or not, on the side of the convergence (a), with a coupling sleeve (2) configurated externally at (2a) to permit the injection of a fluid under pressure and the laminar flowing thereof toward the Venturi tube (1).

The sleeve (2) is provided internally, directly or in an inserted manner, with an axial sheath (2b) for communication between the Venturi tube (1) and for instance an enclosure (3) to which the sleeve (2) may be connected. The sheath (2b) co-operates with the convergence (a) at the level of the neck (b), as stated before, in order to originate at this level the sudden change in section. The result of this is therefore the dynamic sealing area (Z).

The external periphery of the sheath (2b), in combination with the inside wall (2c) of the sleeve, constitutes an annular space or chamber (2d) which communicates with the convergence (a) for the flow and the introduction of the fluid into the Venturi tube.

In an important manner, which is not absolutely necessary, but which is strongly advisable, the external section (S) of the end of the sheath (2), at the level of the neck (b), as well as the section (S') of said neck (b) at right angles with the end of the sheath, must be suitably dimensioned in combination with the section (s) of the solid body to be introduced (FIG. 5). The effectiveness of the system (S and S') (i.e. without the solid body) must be the same as the effectiveness of the system ((S and (S'−s)) so that the ratio S/S and S/S'−s will be equivalent in order to lead to the same coefficient of pressure drop when the energy is transformed. Minimal performance will be set up thereby regardless of the conditions.

As designed, the device is particularly well adapted for the inlet and/or the outlet in a completely sealed manner of solid bodies across an aperture (c) of a treatment enclosure (3) the pressure (Po) of which is lower than the pressure in the immediate surroundings (P3), which may be a further enclosure or the atmospheric pressure.

The solid body or bodies, for instance wires, could be introduced on the side of the divergence (c), i.e. at the pressure level (P3), to be engaged without friction within the bore of the sheath (2) in order to be introduced through the aperture (o) into the enclosure (3) at the pressure (Po) to be subjected to various treatments in accordance with the desired specific applications. The dynamic sealing area which has been originated will prevent the enclosure (3) to be polluted either by the device or by the surroundings.

Moreover, it will be observed, in a particularly important manner, that the solid body or bodies introduced into the device and/or the divergence (c) arrive into the processing tank entirely dry and dust free, considerable advantages being of course obtained thereby.

Depending on the cases of application, the device (D) may for instance be mounted as indicated, on one side only of the enclosure (3) (FIG. 6), the solid bodies being introduced (manually, automatically) or by any appropriate means, on the same side of the divergence (C).

Conversely, for a continuous processing of the solid bodies, the enclosure may be provided with two devices in accordance with the invention, and situated on the same axial alignment (FIG. 7), one of the devices corresponding to the inlet of the solid bodies, the other one corresponding to the outlet thereof. The sleeve (2), opposite to the divergence (c), is still located on the low pressure side (for instance enclosure).

It is obvious that in accordance with the laws of dynamics of the fluid, the various parameters are calculated so that there will be no possible creeping of the fluid from the outside toward the interior of the enclosure.

The injected fluid may be water, oil or the like.

Likewise, the sleeve (2) may be provided internally with various arrangements, for instance to make adjustable in the linear position the communication sheath, to permit the solid bodies to be guided, etc.

As such, the invention may be used in a particularly advantageous manner for the vacuum treatments, as well as for the chemical or electrochemical surface treatment of solid bodies having a substantial length, such as wires, section irons, sheet metals, etc.

In the latter specific case of use concerning the chemical or electrochemical treatments, important advantages are offered by the device relative to the well-known procedures which are presently in use. Generally, and as shown quite schematically in FIG. 8, the wire (F) to be processed was to follow a special path to pass from a tank (A) to the other tank, in order to be subjected to the various necessary treatments (degreasing, pre-rinsing, rinsing, depassivation, galvanic deposit).

With the device in accordance with the invention, it is possible, more particularly, to suppress this complex path of the wire and to enhance the processing in a relatively important manner, as in accordance with the prior art, and as an indication, it was possible to carry out the treatment quite approximately under 1A/dm2, whereas the application of the device, with a very intensive agitation, makes it possible to carry out the processus up to 5 to 10 A/dm2.

Referring now to FIG. 9, there is shown here, as an example which is not restrictive in any way, an installation for the application of the device to a chemical or electrochemical treatment.

The installation includes obviously a plurality of processing tanks, which are denoted generally at (B).

At the inlet of the first tank (B1), there is mounted the device (D) connected on the sides of the convergent to a low pressure enclosure (E) the calibrated inlet aperture of which serves for load drops. Between each one of the following tanks are mounted in an opposite manner two venturi tubes (1)-sheath (2) assemblies, the convergences of each one of said assemblies being coupled by means of a low pressure common chamber (E1). It is pointed out that the low pressure chamber (E1) may be provided with an electrovalve shell and control means for the balance leakages of the vapour pressures.

The last tank (B2), at the outlet thereof, and like the first tank (B1) at the inlet thereof, is provided with a Venturi tube (1)-sheath (2) assembly, the convergent of which is connected to a low pressure enclosure (E2). The convergences of each one of the Venturi (1)-sheath (2) assemblies are conveniently coupled to pumping means (P) related to each one of the corresponding tanks.

The wire or other solid body to be processed may therefore be introduced, treated and removed from the first tank to the last one in an entirely linear manner, contrary to the well-known systems.

The association and combination of several devices in accordance with the invention are also contemplated in order to make the system more effective still, thanks to the accumulation of the advantages of each one of the devices taken separately.

This association may be effected either by combining n devices mounted in series, or with n groups of two devices mounted opposite.

The advantages are clearly apparent from the description, and the following is to be more particularly pointed out:

the simplicity of the device;

the steady and complete sealing provided between the surroundings and the treatment enclosure;

the products introduced into the device on the side of divergent arrive into the low pressure tank entirely dry, making it possible thereby to avoid the use of expensive and complex auxiliary means.

The invention is not limited in any way to the use nor to the form of embodiment of the various parts thereof which have been more particularly described, and any alternative form of embodiment remains within the scope of the invention.

We claim:

1. Device for the introduction and/or the withdrawal of solids through at least one orifice of an enclosed treatment area, low-pressure vat or the like whose pressure is lower than that of the immediate environment, comprising:

a Venturi tube constituting in its interior and in succession a convergence, a neck and a divergence thereby defining a convergence side and a divergence side, whereby a fluid injected through said Venturi tube produces a region of low pressure in said neck;

a coaxial sleeve on said convergence side into which the solid to be treated can be introduced, which sleeve is partially engaged inside said Venturi tube over a length determined in such a manner as to create a rapid change of section which defines a dynamic joint zone in combination with the pressure, flow and speed of the fluid injected toward the inside of the Venturi tube.

2. Device according to claim 1 in which the outer section (S) of the end of said sleeve inside said Venturi tube as well as the inner section (S') of said Venturi are dimensioned in combination with the section (s) of the solid or solids to be introduced in such a manner that the effectiveness of the system (S) and (S') is the same as the effectiveness of the system (S) and (S'-s) in order to lead to the same coefficient of pressure rise during the conversion of energy.

3. Device according to claim 1 in which the fluid basically at the entry of the convergence is at an initial pressure and an initial speed which are determined so as to pass through a pressure which is zero or basically zero at the level of a rapid widening of section created by the end of the sleeve and to rise back to atmospheric pressure at the exit of the divergence.

4. Device according to claim 1 in which the sleeve is engaged in the Venturi tube along a length which is such that the rapid change of section occurs at the level of the connection part of the convergence and of the neck.

5. Device according to claim 1 in which the sleeve is engaged in said Venturi tube over such a length that the rapid change of section occurs upstream from said neck in said convergence.

6. Device according to claim 1 in which said sleeve is engaged in said Venturi tube over such a length that the rapid change of section occurs at a part of the length of the neck.

7. Device according to claim 1 and its application in chemical or electrochemical treatments of solids by means of a series of treatment vats, whereby the first of these vats is coupled to said Venturi tube sleeve assembly whose convergence is connected to a low-pressure chamber and each of the other vats communicates over two Venturi tubes sleeve assemblies mounted in opposition and whose convergences are coupled over a common low-pressure chamber, while the last vat, at the end of the treatment, is connected to another Venturi tube sleeve assembly whose convergence is connected to a low-pressure chamber, and whereby the convergences of each of the Venturi sleeve assemblies are suitably coupled to pumping means relative to each of the corresponding vats.

8. Device according to claim 1 and the association of several Venturi tube sleeve assemblies by combining a certain number of assemblies mounted in series or by combining a certain number of groups of two assemblies mounted in opposition.

* * * * *